United States Patent [19]

Chang et al.

[11] 4,324,038
[45] Apr. 13, 1982

[54] METHOD OF FABRICATING MOS FIELD EFFECT TRANSISTORS

[75] Inventors: Chuan C. Chang, Berkeley Heights; James A. Cooper, Jr., Warren; Dawon Kahng, Bridgewater Township, Somerset County; Shyam P. Murarka, New Providence, all of N.J.

[73] Assignee: Bell Telephone Laboratories, Incorporated, Murray Hill, N.J.

[21] Appl. No.: 209,755

[22] Filed: Nov. 24, 1980

[51] Int. Cl.³ .......................................... H01L 21/28
[52] U.S. Cl. .................................. 29/571; 29/591; 148/187; 357/23; 357/65
[58] Field of Search ............... 29/571, 591; 148/187; 357/23.65

[56] References Cited
U.S. PATENT DOCUMENTS

| 3,735,482 | 5/1973 | Norris et al. ........................... 29/571 |
| 3,848,328 | 11/1974 | Ando et al. ........................... 29/591 X |
| 3,967,981 | 7/1976 | Yamazaki ............................ 148/175 X |
| 4,102,733 | 7/1978 | De La Moneda et al. ...... 148/187 X |
| 4,268,952 | 5/1981 | Gaensslen et al. .............. 148/187 X |

OTHER PUBLICATIONS

Nishimatsu et al., *Jpn. J. of Appl. Physics*, vol. 16 (1977), Suppl. 16-1, pp. 179-183.

*Primary Examiner*—G. Ozaki
*Attorney, Agent, or Firm*—David I. Caplan

[57] ABSTRACT

A method for making a MOSFET device (20) in a semiconductor body (10) includes the step of forming source and drain contact electrodes (12.1, 12.2) prior to growth of the gate oxide (10.3) and after formation of a high conductivity surface region (10.5). The exposed mutually opposing sidewall edges of each of the contact electrodes (12.1, 12.2) are coated with a sidewall silicon dioxide layer (15.1, 15.2), and the then exposed surface of the semiconductor body (10) between these sidewalls is etched to depth beneath the high conductivity surface region (10.5) in order to separate it into the source and drain regions (10.1, 10.2).

Formation of the high conductivity region may be omitted by using Schottky barrier or impurity doped material for the contact electrodes (12.1, 12.2).

20 Claims, 6 Drawing Figures

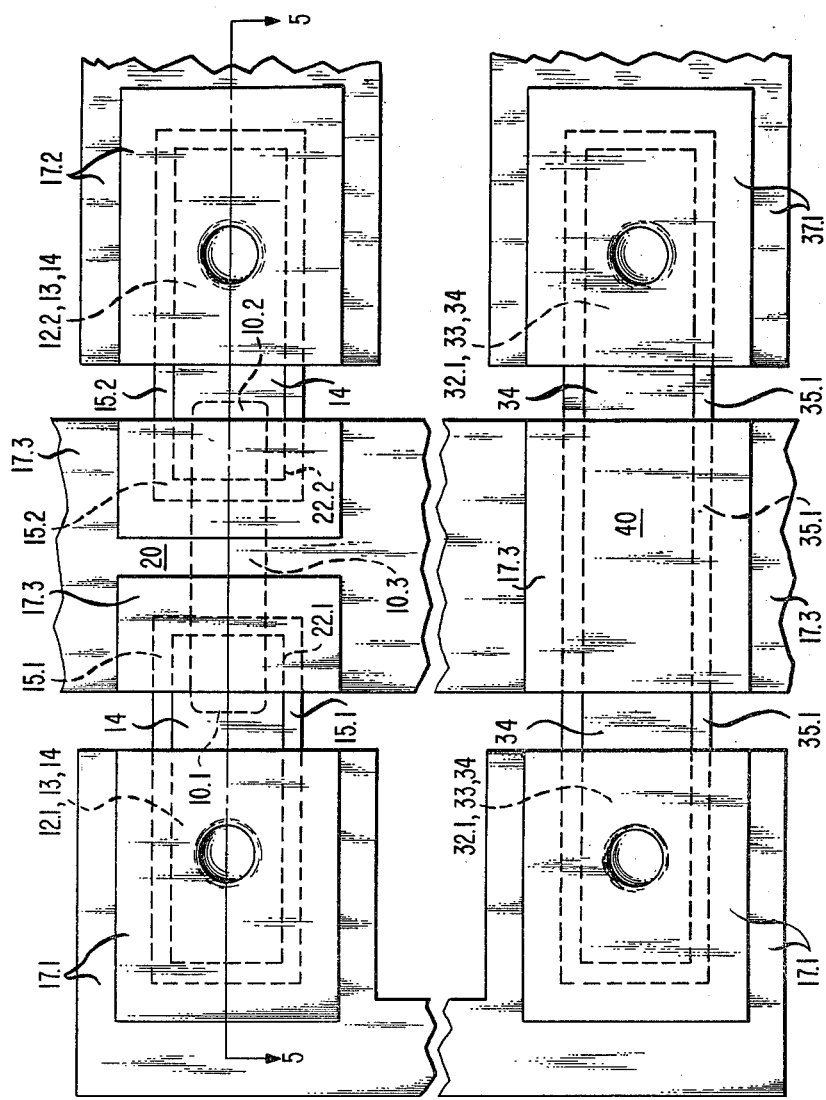

METHOD OF FABRICATING MOS FIELD EFFECT TRANSISTORS

Field of the Invention

This invention relates to the field of semiconductor device fabrication, and more particularly to methods for fabricating metal oxide semiconductor field effect transistor (MOSFET) devices.

BACKGROUND OF THE INVENTION

It is known in the art of semiconductor transistor devices that short channels are desirable in MOSFET devices, in order to achieve high frequency operation of the order of GHz. By "short channels" is meant those with source-to-drain separations of less than about 2 microns.

In the fabrication of short channel MOSFET devices with polycrystalline silicon gate electrodes, it is difficult to control the length of the polycrystalline silicon ("polysilicon") layer defining the self-aligned gate and hence the source-to-drain separation and the channel length: This length is thus subject to fluctuations from device to device in the usual mass fabrication techniques in which many such devices are simultaneously fabricated at a major surface of a single crystal semiconductive silicon body. Specifically, the actual channel length is so small in many of the devices whose channels are intended to be a micron in length that undesirable "punch-through" or "reach-through" of the depletion region of the drain to the source occurs during operation; thereby, device performance is severely degraded. Moreover, the electrical resistance between the source terminal and the semiconductor region controlled by the gate, as well as the electrical resistance between the drain and the load, tends to be excessive, especially in those devices having shallow junctions which are desirable to minimize "punch-through" or "reach-through" effects.

In a paper by S. Nishimatsu et al., entitled "Grooved Gate MOSFET", published in *Japanese Journal of Applied Physics*, Vol. 16 (1977), Supplement 16-1, pp. 179–183, at page 181, a method for making a MOSFET device characterized by a grooved gate is disclosed, using a first polysilicon layer for the source and drain contact electrodes and a second polysilicon layer for the gate electrode. These electrodes are mutually insulated from each other by a silicon dioxide layer which is grown on the first polysilicon layer prior to deposition of the second polysilicon layer. Such a device, however, requires the use of a maskless photolithography operation which becomes impractical at channel lengths less than about 2 microns. As a consequence of this limitation, the distance from source-to-drain cannot be made as small as desired, such as 0.5 micron to within ±5%, and the breakdown voltage tends to be unduly low. Moreover, the use of polysilicon as source and drain electrode material results in undesirably high source and drain access resistances.

It would, therefore, be desirable to have a method for making short-channel devices that alleviates these problems of the prior art.

SUMMARY OF THE INVENTION

This invention is for a method of fabricating a semiconductor device (20) having a pair of spaced-apart source and drain contact electrodes (12.1, 12.2) contacting spaced-apart surfaces of source and drain regions (10.1, 10.2), respectively, at a top surface of a semiconductor body (10) and having a gate oxide layer (10.3) grown on a first portion of the top surface characterized by the step of depositing, prior to growth of the gate oxide layer (10.3), a sidewall insulating layer (15.1, 15.2) on an exposed edge of each of the contact electrodes (12.1, 12.2) located on mutually opposing sidewalls of these contact electrodes followed by the step of thermally growing the gate oxide layer (10.3) on the exposed first portion of the top surface of the body extending between the mutually opposed extremities of the sidewall insulating layers (15.1, 15.2). The contact electrodes (12.1, 12.2) are essentially metal, metal-silicide, or silicon rich metal-silicide. Moreover, another electrode layer (16), typically polysilicon, can be deposited on both the gate oxide layer (10.3) and the sidewall insulating layers (15.1, 15.2), in order to provide a gate electrode (16.3) after suitable patterning of this electrode layer (16). Further, the sidewall insulating layers (15.1, 15.2) advantageously extend to other sidewalls (22.1, 22.2) of the source and drain contact electrodes (12.1, 12.2) removed from the mutually opposing sidewalls, in order to insulate the gate electrode (16.3) from the source and drain contact electrodes (12.1, 12.2) extending to these other sidewalls (22.1, 22.2).

In one specific embodiment, a top surface region (10.5) of body (10) is doped with impurities suitable for forming source and drain regions, each of the contact electrodes (12.1, 12.2) is formed together with its corresponding sidewall insulating layer (15.1, 15.2) and an insulating layer (13, 14) covering its top surface, and semiconductor material at the first portion of the top surface of the body (10) is removed to form a recess of depth sufficient to separate the top surface region (10.5) into the source and drain regions (10.1, 10.2). In another specific embodiment, source and/or drain regions are formed, typically during growth of the gate oxide (10.3), by diffusion of impurities from the corresponding source and/or drain contact electrode(s) (12.1, 12.2). In yet another specific embodiment, doping of both source and drain regions is omitted, the source and drain contact electrodes (12.1, 12.2) forming Schottky barrier contacts to the body (10).

BRIEF DESCRIPTION OF THE DRAWING

This invention, together with its features, advantages, and objects, may be better understood from the following detailed description when read in conjunction with the drawings in which:

FIG. 6 shows a top view of the device shown in FIG. 5, further illustrating a typical metallization cross-under for interconnection.

Only for the sake of clarity, none of the drawings is to any scale. Although the detailed description is largely in terms of fabricating but a single MOSFET device, it should be understood that many such similar devices, together with their interconnections, can be simultaneously fabricated in a single crystal semiconductor body.

DETAILED DESCRIPTION

Figure 1:
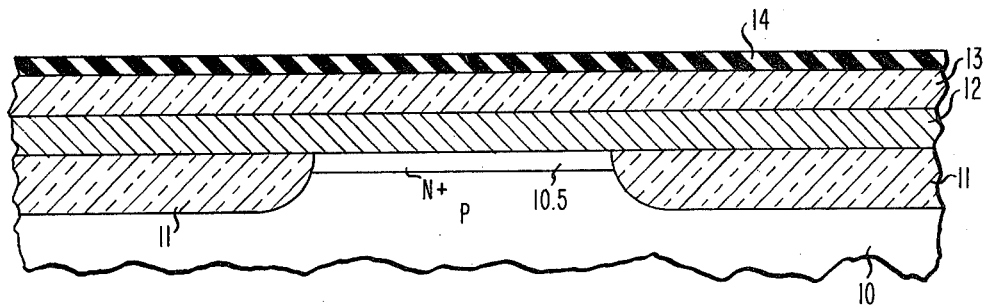
FIGS. 1 through 5 depict in cross section a sequence of successive stages in the fabrication of a MOSFET device in accordance with a specific embodiment of the invention.

As indicated in FIG. 1, the starting material is a P-type single crystal semiconductive silicon body 10, typically of surface orientation <100> with an excess boron acceptor impurity concentration of the order of $10^{16}$ per $cm^3$. An N+ doped surface region 10.5 is formed, typically by arsenic ion implantation, over a whole major surface of this body 10; and substantially planar field oxide portions 11 are then formed at selected locations of the surface, for example, by using conventional methods or the technique described in a pending application Ser. No. 128,841, filed on Mar. 10, 1980 by D. Kahng et al. (35-8). Thereby, the N+ doped surface region 10.5 remains, extending between neighboring field oxide portions 11. Alternatively, a conventional non-planar field oxide can first be thermally grown in accordance with a desired pattern and an N+ implant of arsenic could then be performed after the field oxide has been patterned. Ordinarily, a channel stop diffusion of acceptor impurities is performed, in order to provide a P+ channel stop region (not shown) underlying the field oxide 11.

Figure 3:
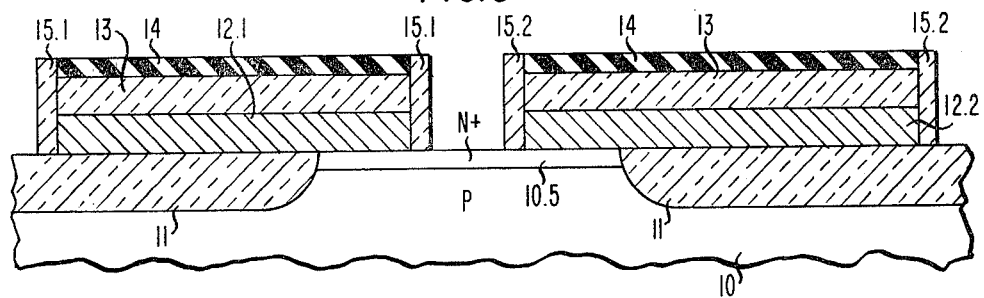
Figure 4:
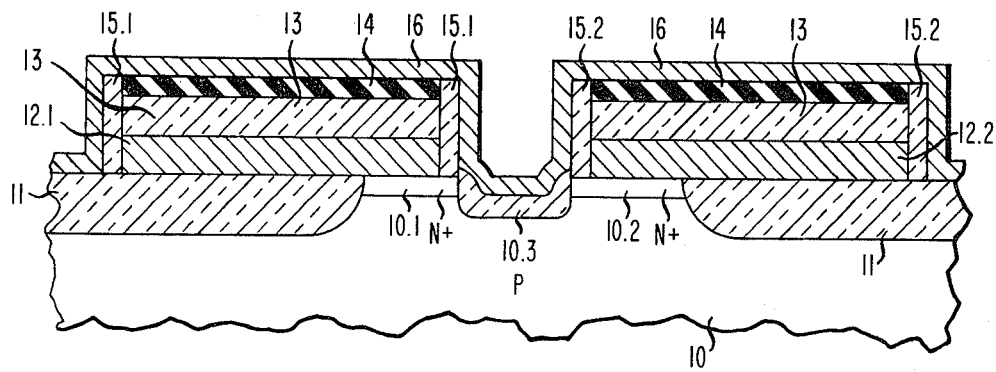

Next, a refractory metal or a refractory metal-like layer 12, is deposited over the entire top surface of the body 10. For example, a layer of the metal-like titanium (or tantalum) silicide, typically about 2000 Angstroms in thickness, is deposited by co-sputtering of titanium (or tantalum) and silicon onto the silicon body 10. Alternatively, a silicon rich metal-silicide can also be used for the layer 12, such as silicon rich titanium silicide containing preferably about 25 percent extra silicon or silicon rich tantalum silicide containing preferably about 5 percent to 10 percent extra silicon, either of them formed by co-sputtering of silicon and the corresponding metal. Then, a relatively thick (typically about 0.5 to 1 micron) first intermediate insulating layer 13, typically of silicon dioxide, is deposited, typically by a chemical vapor deposition step at a low pressure of about 1 torr. Next, a relatively thin second intermediate insulating layer 14, typically of silicon nitride about 500 to 2000 Angstroms thick, is deposited over the intermediate oxide film 13, to serve as an end-point or etching-stopper during a subsequent (FIG. 3) anisotropic oxide etching step. The structure just after the formation of this nitride layer 14 is illustrated in FIG. 1.

Then the silicon nitride layer 14 and the silicon dioxide layer 13 are successively patterned and etched anisotropically, typically using a dry neutral or ion beam or plasma etching technique, to expose the metal or metal-like layer 12. The thus exposed layer 12 is then etched, typically by anodization or other dry techniques suitable for the particular metal or metal-like material of the layer 12, to form spaced-apart electrode contact layers 12.1 and 12.2 each contacting the N+ region 10.5. The semiconductor material at the surface of the body 10 at the central portion of the gap between these electrode contacts 12.1 and 12.2 will ultimately form the active channel region of the completed MOSFET device.

Figure 2:
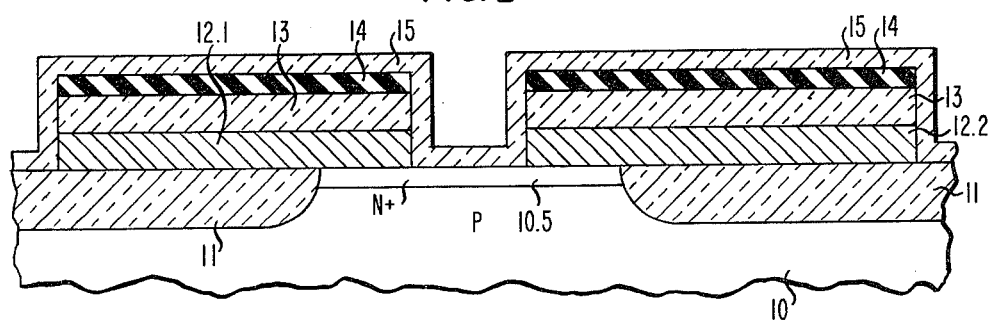

Then, as indicated in FIG. 2, another oxide layer 15 is deposited over the top surface of the whole structure, in a manner similar to the previously deposited intermediate oxide layer 13. The oxide layer 15 typically is about 2000 Angstroms thick, but can be varied to control the width of the channel over which an electrode layer 16 is to be deposited. This oxide layer 15 is then subjected to anisotropic etching, typically dry etching with $CFH_3$ and ammonia until the end-point silicon nitride layer 14 is reached; the top surface of the silicon nitride 14 and the top surface of the N+ region 10.5 thus serve as etching stoppers. Thereby (FIG. 3) only sidewall oxide layers 15.1 and 15.2 of the material of the originally deposited oxide layer 15 remain in the structure; that is, this oxide remains only on the vertical sidewall edges of the nitride layer 14, of the intermediate oxide layer 13, and of the contact electrodes 12.1 and 12.2. These sidewall oxide layers 15.1 and 15.2 serve to passivate the edges of the contact electrodes 12.1 and 12.2; and, in addition, the sidewall oxide layers 15.1 and 15.2 serve both to adjust the electrical channel length of the MOSFET device 20 (FIG. 5) being fabricated and to insulate the metallization to be formed, as discussed more fully below.

Next, the silicon material at the portion of the top surface of the N+ region 10.5 thus exposed by the anisotropic etching is itself etched by a plasma or other etching process for a time sufficient to form a recess in the silicon deep enough to penetrate beneath the N+ surface region 10.5; thereby this N+ region is separated into a pair of spaced-apart N+ source and drain regions 10.1 and 10.2. The structure is then thermally oxidized to grow a gate oxide layer 10.3, either by a dry or wet oxidation, including also appropriate cleaning steps, as necessary, as known in the art.

Figure 5:
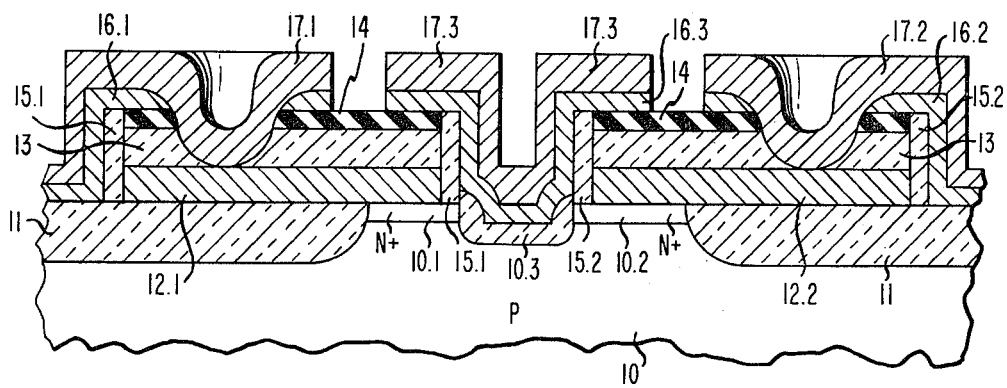

If desired for such purposes as adjusting the threshold voltage of the transistor being fabricated, an impurity ion implantation may be performed, either just before or after growth of this gate oxide layer 10.3, in order to dope the channel portion with impurities in a suitable concentration profile (not shown) for the completed device 20 (FIG. 5).

Then, a relatively thin electrode layer 16, typically polysilicon in the range of about 500 to 300 Angstroms thick, is deposited and impurity doped, as by diffusion therein of phosphorus, suitably for making the thus doped polysilicon useful as a gate electrode. The electrode layer 16 should be characterized by good step coverage over the rather steep exposed surface of the sidewall oxide layers 15.1 and 15.2. For depositing the polysilicon layer 16, a chemical vapor deposition step can be used, for example, a deposition using a system of 30 percent to 100 percent silane in a nitrogen carrier, preferably at a low pressure, typically of about 0.25 to 0.5 torr. Thus, the electrode layer 16 supplies a good foundation for electrical interconnections.

Apertures are then etched through the electrode layer 16, the silicon nitride layer 14, and the intermediate oxide layer 13, to expose the contact electrode layers 12.1 and 12.2, for electrical access thereto. Finally (FIG. 5) for the purpose of interconnect metallization, a metal layer is deposited, illustratively an aluminum layer by evaporation, over the top surface of the structure; and this metal layer is patterned, as by conventional masking and etching, to form the desired gate electrode interconnect layer 17.3 and the source and drain electrode interconnect layers 17.1 and 17.2. The electrode layer 16 is also similarly patterned into a gate electrode segment 16.3 and source and drain electrode segments 16.1 and 16.2. Thereby, the electrode combinations 16.1-17.1, 16.2-17.2, and 16.3-17.3 form double-layer interconnect metallizations for the source, drain, and gate, respectively, of the MOSFET device 20.

The gate electrode interconnect layer 17.3 need not cover the polysilicon gate electrode segment 16.3 in regions overlying the sidewall oxide layers 15.1, 15.2, or the gate oxide 10.3; the purpose of the gate electrode interconnect layer 17.3 is to lower the resistance of interconnection with the gate electrode segment 16.3.

It should be noted that the length of the source-to-drain channel in the device 20 is defined along a U- shaped line, and thus this channel length is determined by the depth of the recess in the semiconductor body 10 as well as by the thickness of the sidewall oxide 15.1 and 15.2. The resulting channel length can thus be made to be about a micron or less.

In an illustrative example, the doping level resulting in the source and drain regions 10.1 and 10.2 is of the order of $10^{18}$ per cm$^3$ to a depth of about 0.25 microns. The recess in the N+ region 10.5 separating the source from drain has a depth of about 0.40 microns, that is, about 0.15 microns deeper than the source and drain regions themselves; thus the depth of the recess is about 1.5 times or more the depth of the N+ region 10.5.

It should be noted that the impurity doping to form the N+ region 10.5 may be omitted; and the contact electrodes 12.1 and 12.2 are then made of materials which form a Schottky barrier with the silicon body 10, or the electrode layer 12 may be initially itself doped with impurities which later (particularly during thermal growth of the gate oxide 10.3) diffuse out into the silicon body to form the source and drain regions 10.1 and 10.2. In such cases, it may not be necessary to form such a deep recess, if any at all, in the silicon body.

FIG. 6 shows the top view of device 20, together with an illustrative metallization cross-under 40 with respect to its gate electrode 17.3 as an example. Other elements in FIG. 6 not previously described, and which are fabricated simultaneously with those of FIGS. 1–5, are labeled with reference numerals which are equal to those of FIGS. 1–5 plus 20. A similar type of cross-under can obviously be made with respect to other metallization lines than the gate electrode. It should be noted that the gate electrode 16.3 is also insulated from the source and drain contact electrodes 12.1 and 12.2 in such other regions as sidewall edge surfaces 22.1 and 22.2 of the contact electrodes where this gate electrode 16.3 is formed and that these contact electrodes 12.1 and 12.2 overlie field oxide portions 11 removed from the source and drain regions 10.1 and 10.2.

Although the invention has been described in terms of specific embodiments, various modifications can be made without departing from the scope of the invention. For example, instead of depositing the silicon dioxide layer 15 by chemical vapor deposition, such other techniques as plasma deposition also be used. Moreover, P and N-type semiconductive material may be interchanged, in order to form P-channel MOSFET devices rather than N-channel as described above. Also, instead of a metal-like silicide, the contact electrodes 12.1 and 12.2 can be made of a metal, such as tungsten, and can be initially deposited in accordance with the desired spaced-apart configuration as by a photodeposition process, as known in the art, thereby avoiding the need for masking and etching of the electrode layer 12. Moreover, the second intermediate layer 14 can be a material chemically different from silicon nitride, such as a metal, polysilicon, or an organic polymer, providing such material is resistant to the etch employed to pattern the silicon dioxide layer 15. Finally, the silicon nitride layer 14 can be eliminated, provided that the oxide layer 13 is made sufficiently thick for providing a suitable margin in stopping the etch of the silicon dioxide layer 15.

We claim:

1. A method of fabricating a semiconductor device (20) having a pair of spaced-apart source and drain contact electrodes (12.1, 12.2) contacting spaced-apart surface areas of source and drain regions (10.1, 10.2), respectively, located at a top surface of a semiconductor body (10) and having a gate oxide layer (10.3) grown on a first portion of the said top surface located between said apart areas characterized by the step of forming a sidewall insulating layer (15.1, 15.2) on an exposed mutually opposing sidewall edge surface of each of the contact electrodes (12.1, 12.2), followed by the step of thermally growing the gate oxide layer (10.3).

2. The method of claim 1 further characterized by the step of forming an intermediate insulating layer (13, 14) on an exposed top surface of the contact electrodes (12.1, 12.2), followed by the step of forming each said sidewall insulating layer (15.1, 15.2) by depositing an insulating layer (15) on exposed portions of the top surface of the body (10) located between said spaced-apart surface areas, on each said mutually opposing sidewall edge surface, on an exposed top surface of the intermediate insulating layer (13, 14), and on at least one other sidewall edge surface (22.1, 22.2) of each of the contact electrodes (12.1, 12.2) and followed by anisotropic etching of said insulating layer (15) whereby material of said insulating layer (15) remains on each of said mutually opposing sidewall edge surfaces to form each said sidewall insulating layer (15.1, 15.2) but does not remain on said top surfaces.

3. The method of claim 1 or 2 further characterized in that said contact electrodes (12.1, 12.2) are essentially metal-silicide, silicon rich metal-silicide, or metal.

4. The method of claim 3 further characterized by the step of depositing an electrode layer (16) extending over both said gate oxide layer (10.3) and each said sidewall insulating layer (15.1, 15.2).

5. A method for making a MOSFET device (20) comprising the steps of:
   (a) forming a pair of spaced-apart contact electrodes (12.1, 12.2) whose top surfaces are coated with an intermediate insulating layer (13, 14), said electrodes (12.1, 12.2) being essentially metal, metal-silicide, or silicon rich metal-silicide, and said electrodes making contact with spaced-apart areas of a top surface of a semiconductor body (10);
   (b) forming sidewall edge insulating layers (15.1, 15.2) on exposed mutually opposed sidewall edges of each of said contact electrodes (12.1, 12.2) contiguous with said spaced-apart areas of contact;
   (c) forming a recess in the body (10) at the top surface thereof located between said sidewall insulating layers (15.1, 15.2) to at least a predetermined depth;
   (d) forming a gate oxide layer (10.3) coating said recess; and
   (e) forming a gate electrode layer (16.3) covering both said gate oxide layer (10.3) and each of the sidewall insulating layers (15.1, 15.2).

6. The method of claim 5 in which each said sidewall insulating layer (15.1, 15.2) is formed by deposition of an insulating layer (15) on exposed portions of the top surface of the body (10) located between said contact electrodes (12.1, 12.2) on each said mutually opposing sidewall edge, on an exposed surface of the intermediate insulating layer (13, 14), and on at least one other sidewall edge surface (22.1, 22.2) of each of the contact electrodes (12.1, 12.2), followed by anisotropic etching to remove said insulating layer (15) from said top surfaces but not from any of said edge surfaces of the electrode (12.1, 12.2).

7. The method of claim 6 in which the semiconductor body (10) is single crystal silicon, the insulating layer

(15) is silicon dioxide, and the gate oxide layer (10.3) is formed by thermal oxidation growth.

8. The method of claim 7 in which the gate electrode layer (16.3) is polycrystalline silicon.

9. The method of claim 6 in which said gate electrode layer (16.3) is formed by a process comprising depositing a polycrystalline silicon layer (16) simultaneously on said sidewall edge insulating layers (15.1, 15.2) and on said gate oxide layer (10.3).

10. The method of claim 6 in which impurities of opposite conductivity type from that of the bulk of the body (10) are introduced into the body (10) to form a doped region (10.5) of predetermined depth contiguous with the top surface of the body (10) between field oxide layer portions (11) prior to depositing a contact electrode layer (12) on said doped region (10.5), and then patterning said electrode layer (12) to form said spaced-apart electrodes (12.1, 12.2) thereby exposing a portion of said doped region (10.5) co-centered with the recess, the predetermined depth of said recess being greater than that of the region (10.5).

11. The method of claim 5, 6 or 10 in which the intermediate insulating layer comprises a layer (13) of silicon dioxide.

12. The method of claim 10 in which said depth of the recess is greater than said depth of the doped region (10.5) by a factor of about 1.5 or more.

13. The method of claim 11 in which the intermediate insulating layer further comprises a layer (14) of silicon nitride on the layer (13) of silicon dioxide.

14. The method of claim 6 in which at least a portion of each said other exposed sidewall edge surface (22.1, 22.2) is located where said other edge surface is contiguous with a field oxide layer portion (11) intervening between each said other edge (22.1, 22.2) and the top surface of the body (10).

15. The method of claim 6 or 14 in which the body (10) is single crystal silicon, said intermediate insulating layer (13, 14) comprises a first intermediate layer (13) of silicon dioxide covered with a second intermediate layer (14) of chemical composition different from silicon dioxide, and the gate oxide layer (10.3) is formed by thermal oxidation growth.

16. The method of claim 14 in which said gate electrode layer (16.3) is formed by the step of depositing a layer of material of said gate electrode (16.3) as a continuous electrode layer (16) extending over both said sidewall insulating layers (15.1, 15.2), over said gate oxide layer (10.3), and over said intermediate insulating layer (13, 14), followed by the step of removing selected portions of said continuous electrode layer (16) to expose corresponding portions of said intermediate insulating layer (13, 14).

17. The method of claim 16 in which said electrode layer (16) is essentially polycrystalline silicon.

18. A method of making a MOSFET device comprising the steps of:

(a) forming a pair of spaced-apart field oxide layer portions (11) at a major surface of a semiconductive silicon body (10);

(b) introducing conductivity type determining impurities into the body to form a doped region of predetermined depth (10.5) of the body located contiguous with the major surface thereof in the space between the field oxide layer portions (11), said doped region (10.5) being of opposite type and higher conductivity as compared with the conductivity of the bulk of body ( 10);

(c) depositing a contact electrode layer (12) essentially of metal, metal-silicide, or silicon rich metal-silicide on said field oxide layers (11) and on the exposed portions of said major surface of the body (10) in the space between the field oxide layer portions (11);

(d) forming an intermediate insulating layer (13, 14) on said contact layer (12);

(e) forming a first aperture penetrating through said insulating layer (13, 14) and said contact layer (12), thereby separating said contact layer (12) into a pair of spaced-apart contact electrodes (12.1, 12.2); and thereby exposing a pair of mutually opposed sidewall edges of the contact electrodes (12.1, 12.2) and exposing another portion of the major surface of the body (10) located between said sidewall edges of said contact electrodes (12.1, 12.2);

(f) depositing another insulating layer (15) on said intermediate layer (13, 14), on said exposed sidewall edges of the contact electrodes (12.1, 12.2), and on said another portion of the major surface of the body (10);

(g) anisotropically etching said another insulating layer (15), whereby material of said another insulating layer (15) remains on said sidewall edges of the contact electrodes (12.1, 12.2), thereby forming mutually opposing sidewall insulating layers (15.1, 15.2) on said sidewall edges and thereby exposing yet another, smaller portion of the major surface of the body (10) therebetween;

(h) thermally growing a gate oxide layer (10.3) on the said yet another, smaller portion of the major surface of the body (10); and (i) forming a gate electrode layer (16.3) on said gate oxide layer (10.3), on each of said sidewall insulating layers (15.1, 15.2), and on a selected portion of said intermediate insulating layer (13, 14).

19. The method of claim 18 in which said intermediate insulating layer (13, 14) comprises a silicon nitride layer (14) on a silicon dioxide layer (13).

20. The method of claim 18 or 19 in which, prior to step (h), a recess of predetermined depth greater than that of the doped region (10.5) is formed in the body (10) at said another, smaller portion of the major surface thereof.

* * * * *

UNITED STATES PATENT AND TRADEMARK OFFICE
CERTIFICATE OF CORRECTION

PATENT NO. : 4,324,038
DATED : April 13, 1982
INVENTOR(S) : Chuan C. Chang, James A. Cooper, Jr.,
Dawon Kahng, and Shyam P. Murarka It is certified that error appears in the above-identified patent and that said Letters Patent are hereby corrected as shown below:

Column 4, line 31, "300" should read --3000--.
Column 6, line 20, "12.2)" should read --12.2),--.

Signed and Sealed this

Tenth Day of August 1982

[SEAL]

*Attest:*

GERALD J. MOSSINGHOFF

*Attesting Officer*     *Commissioner of Patents and Trademarks*